United States Patent [19]
Shimizu et al.

[11] Patent Number: 5,847,745
[45] Date of Patent: Dec. 8, 1998

[54] OPTICAL WRITE ELEMENT

[75] Inventors: Yukihiko Shimizu; Kinya Ueda; Yoichi Kobori, all of Mobara, Japan

[73] Assignee: Futaba Denshi Kogyo K.K., Mobara, Japan

[21] Appl. No.: 609,543

[22] Filed: Mar. 1, 1996

[30]     Foreign Application Priority Data

Mar. 3, 1995  [JP]  Japan ................................. 7-044335

[51] Int. Cl.$^6$ ....................................................... B41J 2/47
[52] U.S. Cl. ............................................ 347/227; 347/238
[58] Field of Search ................................. 347/238, 227, 347/226

[56]          References Cited
            U.S. PATENT DOCUMENTS 4,730,203  3/1988  Watanabe et al. ..................... 347/238
4,949,099  8/1990  Shimizu et al. ....................... 347/238

*Primary Examiner*—Mark J. Reinhart
*Attorney, Agent, or Firm*—Oblon, Spivak, McClelland, Maier & Neustadt, P.C.

[57]            ABSTRACT

An optical write element is adapted to be used in an image writing device to form a visual or latent image on a recording medium. The optical write element comprises a rectangular casing having an interior maintained in a high vacuum condition, at least one light-emitting dot array composed of multiple fluorescent light-emitting dots attached along the length of a substrate as part of the casing, at least one cathode placed above the light-emitting dot array, and a pair of shielding members placed over the outside of the light-emitting dot array.

2 Claims, 4 Drawing Sheets

OPTICAL WRITE ELEMENT

BACKGROUND OF THE INVENTION

1. Field of the Invention

This invention relates to an optical write element with arrays of multiple light-emitting dots. The optical write element of this invention has practical applications as a printer light source that can be used in video printers, electronic photographic type printers, label printers and silver salt-type printers.

2. Discussion of the Background

Light-emitting elements based on the principle of fluorescent display tubes are widely used as optical write elements to form any desired visual or latent image by irradiating light in a dot pattern on a film or another recording medium. FIG. 1 shows a sectional view of one conventional example of such an optical write element, while FIG. 2 illustrates an electrode terminal structure and an electrical wiring structure thereof.

In FIG. 1, a rear substrate 1 and a transparent anode substrate 2 are placed opposite one another at a given distance apart. Side plates 3 are mounted between the edges of the two substrates 1 and 2 to form a closed box-shaped casing 4. The casing 4 has an interior maintained in a high-vacuum condition.

As is shown in FIGS. 1 and 2, anode conductors 5 and wiring conductors 6 connected to the anode conductors 5 are formed from aluminum film on the upper interior surface of anode substrate 2 in the casing 4. On the respective anode conductors 5 are formed apertures 5a. The apertures 5a are covered with dot-shaped phosphor layers 7, thereby forming multiple light-emitting dots 8. As shown in FIG. 2, the light emitting dots 8 are arranged into two zigzag-shaped light-emitting dot arrays. The dot pitch for the light-emitting dots 8 is identical in the two parallel rows of light-emitting dots 8. The light-emitting dots 8 in one row are located between the light-emitting dots 8 in the other row when viewed along the length of the respective light-emitting dot rows. The aforementioned wiring conductors 6 extend from the anode conductors 5 along the rows of light-emitting dots 8 and along the direction perpendicular to the rows. An anode voltage Eb is applied to each light-emitting dot 8 via the wiring conductors 6 and a driver IC 13.

Control electrodes 9 and 10 are formed from aluminum film and arranged on the upper interior surface of anode substrate 2 in the casing 4. The control electrode 9 is of a band shape extending along the length of each parallel row of light-emitting dots 8 between the two rows of light-emitting dots 8. The control electrodes 10 also have a band shape and extend parallel to each other between the wiring conductors 6 for the light-emitting dots 8. The control electrodes 9 and 10 are interconnected and commonly supplied with a control voltage Ec. A single filament cathode 11 extends parallel to the rows of the light-emitting dots 8 above the center of the two rows of the light-emitting dots 8 in the interior of the casing 4.

As shown in FIG. 1, the wiring conductors 6 connected to the light-emitting dots 8 and an outside portion of the interior surface of the anode substrate 2 are covered by an insulating layer 12. Disposed above the insulating layer 12 is a driver IC 13, which serves as a light-emitting dot driving element. The driver IC 13 is connected by wires 15 to the wiring conductors 6 and to terminals 14 located on the anode substrate 2.

When the optical write element 20 is operated, electrons emitted from the cathode 11 collide with the light-emitting dots 8 and cause the phosphor layer 7 to emit light. The emitted light from the phosphor layer 7 is irradiated to the outside of the casing 4 via the apertures 5a in the anode conductors 5 and via the anode substrate 2, and reaches the surface of the recording medium which is placed adjacent to the casing 4. In this case, if the recording medium is moved in a direction perpendicular to the row of light-emitting dots 8 synchronized with the operation of the optical writing element 20, it is possible to condense the light from the two rows of light-emitting dots 8 into a single straight line on the surface of the recording medium. Consequently, if the optical write element and the recording medium are moved in particular directions relative to one another, and if the operation of the respective light-emitting dots 8 in the optical write element are synchronized with the movement, then it is possible to create any desired visual image or latent image on the surface of the recording medium.

With the aforementioned conventional optical write element, electrons are charged on the insulating layer 12 formed on the interior surface of the anode substrate 2. The electrical field generated due to these charged electrons adversely affects the emitted light from the light-emitting dots 8, causing the quantity of light from the respective light-emitting dots 8 to be non-uniform.

In addition, the electrical field created by the wires 15 that connect the driver IC 13 to the wiring conductors 6 also affects adversely the emitted light from the light-emitting dots 8. Further, there exists a problem that electrons from the cathode 11 collide with the driver IC 13 and cause non-uniformity in quality of the emitted light and malfunctions of the driver IC 13.

Moreover, the conventional optical write element has posed such problems that the amount of wattless current that flows through the control electrodes and the wiring conductors 6 is large, and that the amount of consumed power is large. As a result, it is necessary to use a thick cathode with a thick layer of an electron-emitting material in order to obtain the given quantity of emitted electrons. This type of thick cathode has a large heater core wire in the center and has low electrical resistance, which means that it cools down easily. Consequently, the low-temperature portion of each end, where the electron emission capacity is lower, becomes longer. Therefore, it is impossible to install light-emitting dots on a portion of the anode substrate 2 that corresponds to this low-temperature portion. This narrows the light-emitting region and enlarges the external size of the casing 4 compared to those that use a thin cathode to obtain an identical light-emitting region.

SUMMARY OF THE INVENTION

It is therefore an object of the present invention to provide an optical write element having a reduced size as compared with a conventional optical write element having the same light-emitting region, and capable of eliminating fluctuation in quantity of light from light-emitting dots, malfunctions of IC elements and wattless current.

In a first aspect of the present invention, there is provided an optical write element comprising a rectangular casing having an interior maintained in a high vacuum condition; at least one light-emitting dot array composed of multiple fluorescent light-emitting dots attached along the length of a substrate as part of the casing; at least one cathode placed above the light-emitting dot array; and a pair of shielding members placed over the outside of the light-emitting dot array.

In a second aspect of the present invention, there is provided an optical write element comprising a rectangular casing having an interior maintained in a high-vacuum condition; at least one light-emitting dot array composed of multiple fluorescent light-emitting dots attached along the length of a substrate as part of the casing; at least one cathode filament placed above the light-emitting dot array; an insulating layer surrounding the light-emitting dot array and covering at least a portion of the substrate; at least one driver IC element placed outside the light-emitting dot array to drive the light-emitting dot array; and a pair of shielding members disposed on two peripheral edges of said insulating layer located between the light-emitting dot array and the driver IC element, the shield members extending upwardly beyond a position where the cathode filament is located.

In accordance with the present invention, since the shielding members shield the insulating layer from electron charge, the fluctuation in quantity of light from the light-emitting dots can be prevented effectively. Furthermore, since the shielding members also shield the anode wiring conductor and thus reduces the amount of wattless current, it is possible to use a thin cathode which has only a small area of reduced electron emitting capacity on each end. This makes it possible to reduce the dimension of the casing required to obtained a given light-emitting region.

BRIEF DESCRIPTION OF THE DRAWINGS

These and other objects and many of the attendant advantages of the present invention will be readily appreciated as the same becomes better understood by reference to the following detailed description when considered in connection with the accompanying drawings; wherein.

DETAILED DESCRIPTION OF PREFERRED EMBODIMENTS

The preferred embodiment of the present invention is now explained below by referring to FIGS. 3 and 4.

Figure 3:
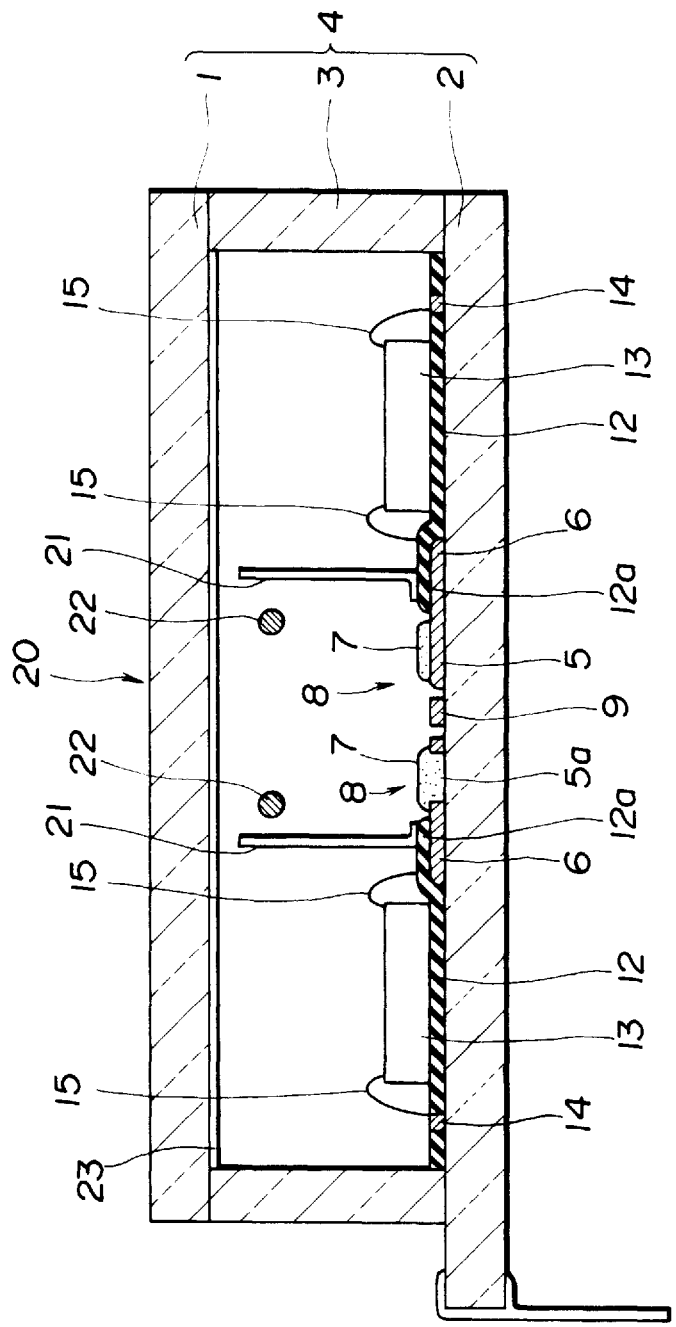
FIG. 3 is a sectional view of an optical write element according to one preferred embodiment of the present invention.
Figure 4:
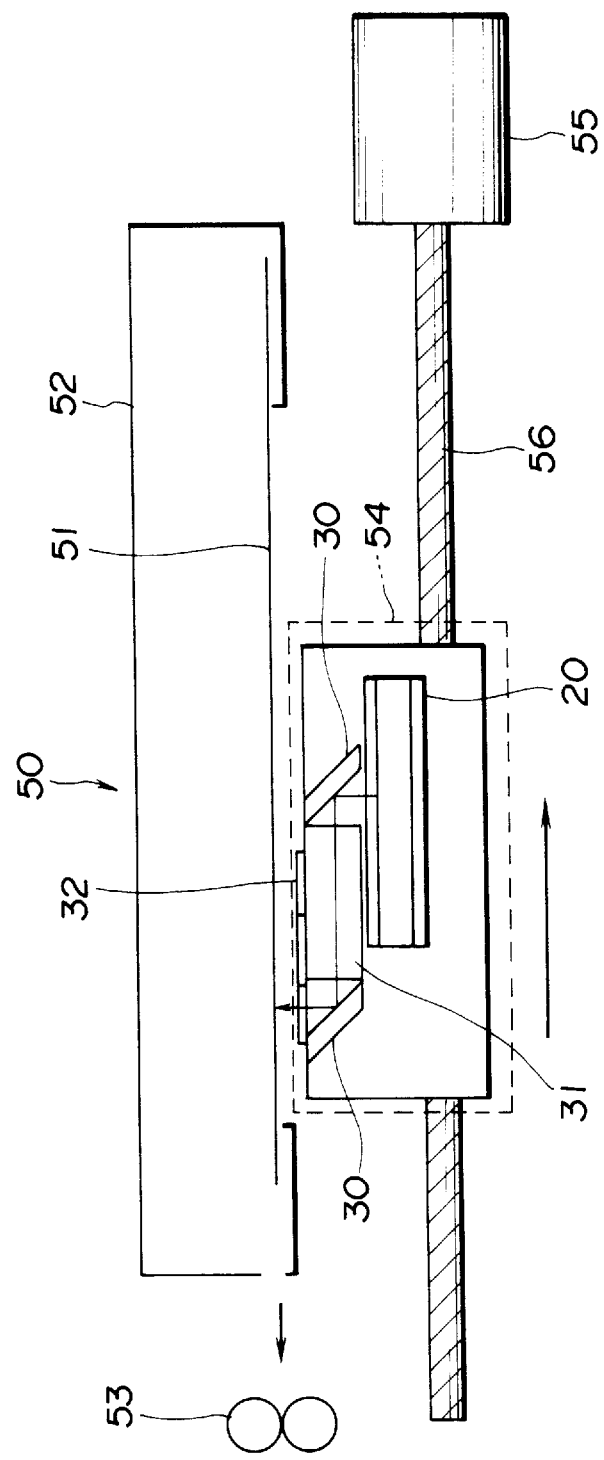
FIG. 4 is a view showing an image writing device into which the optical write element according to the present invention is incorporated.

In the preferred embodiment, an optical write element 20 shown in FIG. 3 is used as a light source for an image writing device shown in FIG. 4. First, a configuration of the image writing device 50 as shown in FIG. 4 is explained. This image writing device 50 is adapted to record images from an electronic still camera, a video camera or a personal computer on a recording medium.

As is shown in FIG. 4, a light-sensitive silver salt-type instant film 51 is used as the recording medium and accommodated within a film package 52. The light-sensitive silver salt-type instant film 51 is exposed to light and delivered to a pair of developing rollers 53 where the film 51 is developed to form a visual image. The exposure of the light-sensitive silver salt-type instant film 51 is carried out by an optical write unit 54. The optical write unit 54 is driven by a motor 55 as a driving means through a ball thread (screw) 56. The ball thread 56 serves for transferring a driving force from the motor 55 to the optical write unit 54. The ball thread 56 is engaged with a nut member (not shown) attached to the optical writing unit 54, to thereby actuate the optical writing unit 54.

As is shown in FIG. 4, the optical writing unit 54 includes, in addition to the optical write element 20, a pair of mirrors 30 and 30 that reflect light in a dot pattern emitted from the optical write element 20, a cylindrical light-condensing lens 31 placed between the pair of mirrors 30 and 30, and an RGB filter 32. The optical write element 20 in this embodiment incorporates a ZnO phosphor. This phosphor includes many components from red (R) to blue (B), so that it is possible to obtain an optical image in the three primary colors by switching the RGB filter 32.

With this image writing device 50, the optical writing unit 54 is driven so that the light-emitting dots of the optical write element 20 emit light at given timing intervals. In addition, the motor 55 rotates the ball thread 56 with timing synchronized to light-emission from the optical write element 20 so that the optical writing unit 54 is moved at a given constant speed. The dot-pattern light from the optical writing element 20 passes through the optical system comprising the mirrors 30, the light-condensing lens 31 and the RGB filter 32 until it reaches the silver salt-type instant film 51 accommodated within the film package 52, where the emitted light forms a latent image. Thereafter, as described above, the light-sensitive silver salt-type instant film 51 is extracted from the film package 52 and developed using developing rollers 53.

Figure 1:
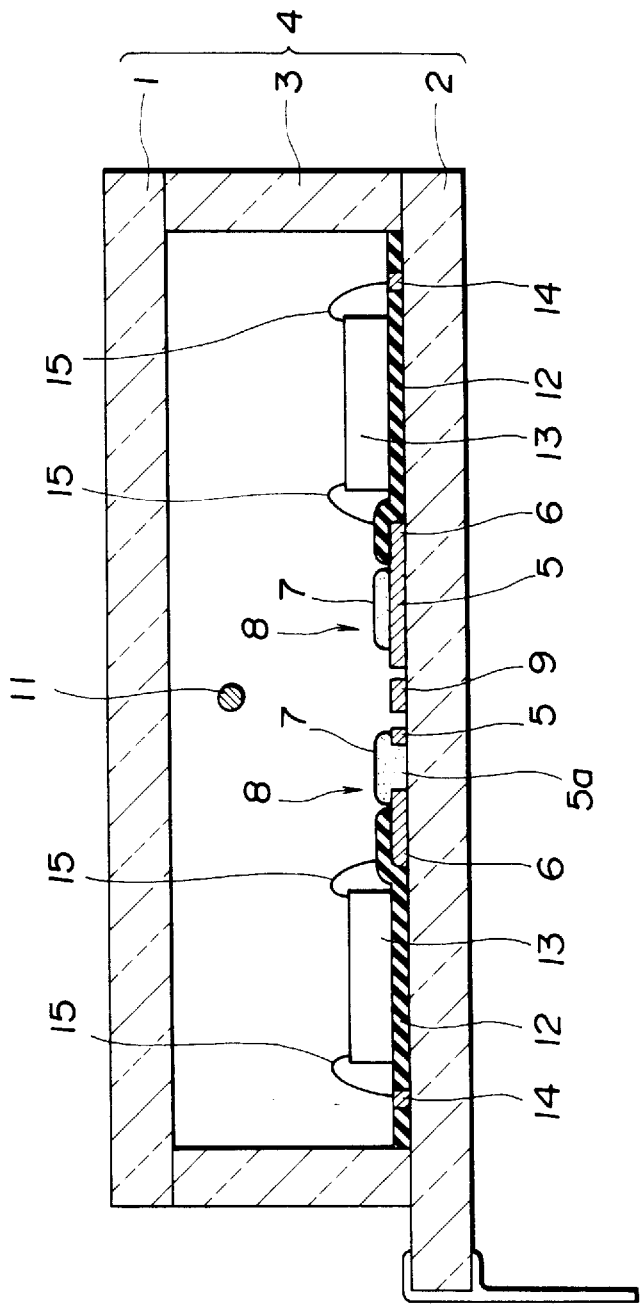
FIG. 1 is a sectional view of a conventional optical write element.
Figure 2:
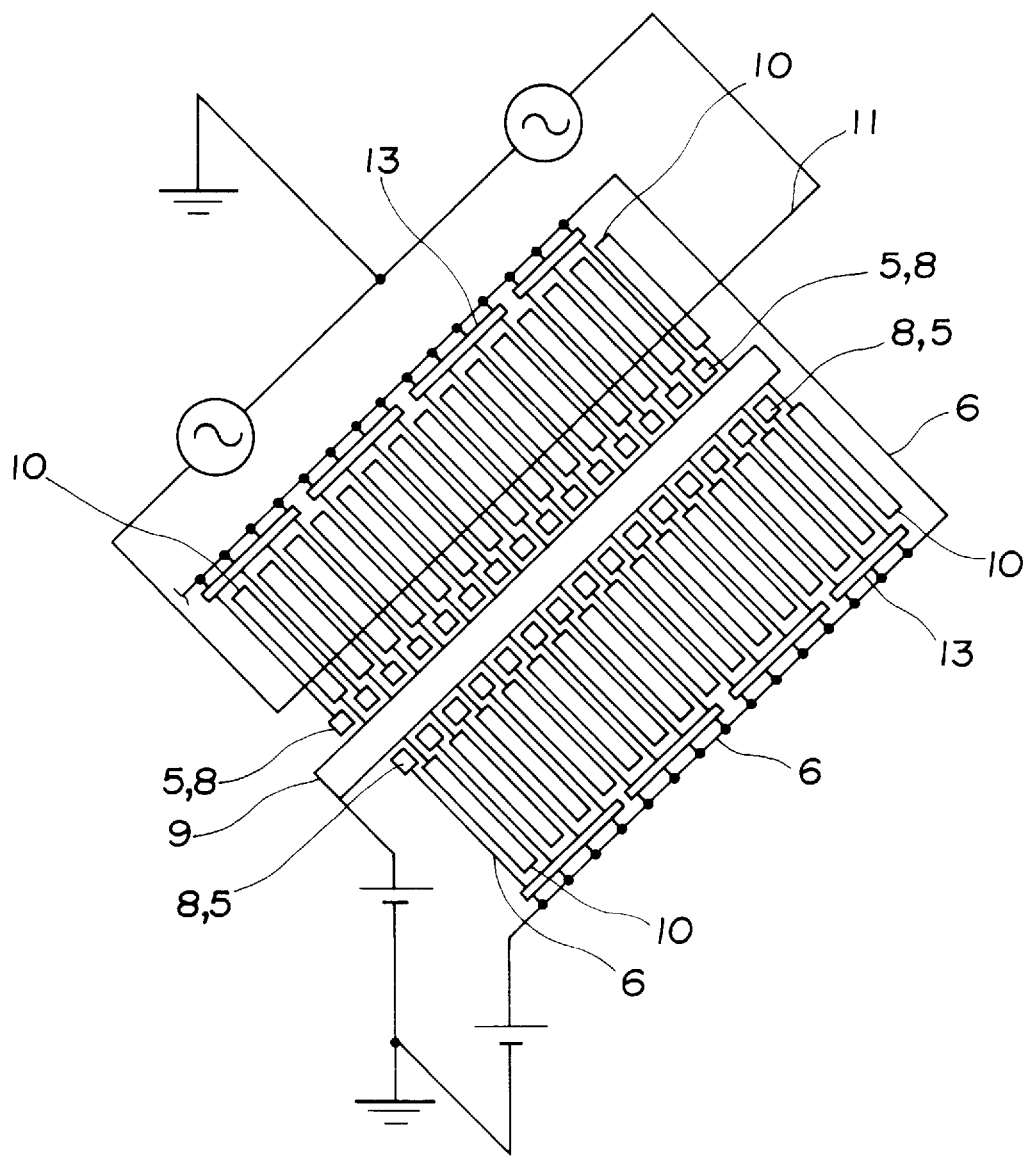
FIG. 2 is a view showing a wiring structure of the optical write element of FIG. 1.

Referring back to FIG. 3, there is shown the detailed configuration of the optical write element 20. Meanwhile, like parts are denoted by like reference numerals as used in. FIG. 1 and therefore detailed explanations therefore are omitted here. An insulating layer 12 surrounds the two rows of light-emitting dots 8 and is located adjacent to the light-emitting dots 8. The insulating layer 12 is provided with inner peripheral portions disposed on opposite sides of the two rows of the light-emitting dots 8. A pair of shielding members 21 and 21 are uprightly elected on the inner peripheral portions of the insulating layer 12. In this embodiment, the shielding members are formed from a 426 Ni—Cr—Fe alloy sheets and are electrically grounded. A height of the shielding members 21 is greater than that of cathodes 22. In this embodiment, two cathodes 22 are arranged in an upper portion of the casing. A graphite shielding film 23 is formed on the inner surface of the rear substrate 1 of the casing 4 to serve as a conductive light-shielding film. An upper end of each shielding member 21 can be attached to the graphite shielding film 23, whereby the shielding member 21 also functions as a contact for the graphite shielding film 23. Alternatively, the shielding member 21 may be arranged in such a fashion as to cover the cathodes 22 but not to contact the graphite shielding film 23. In this cases, it is possible to increase an emission quantity of electrons by applying a voltage of 1 to 2 V to the shielding members 21.

In the optical write element 20 according to this embodiment, the shielding members 21 prevent a majority of electrons from passing to the insulating layer 12. Thus, there is no electron charge on the insulating layer 12, so that electrons have no effect on the light emission activation of the light-emitting dots 8. Therefore, the fluctuations in the quantity of light from the light-emitting dots 8, which is caused by the effects of charged electrons in the insulating layer 12, does not occur.

In addition, the shielding members 21 shield the wires 15 on the driver IC 13 from the light-emitting dots 8, so the electrical field from the wires 15 does not affect the light-emitting activation of the light-emitting dots 8. Therefore, there occurs no fluctuation in the quantity of light from the light-emitting dots 8. Furthermore, since electrons do not collide with the driver IC 13, malfunctions of the driver IC 13 are virtually eliminated.

In addition, the shielding members 21 extends upwardly beyond the cathodes 22 to thereby provide shielding for the rows of light-emitting dots 8 against the outer region of the casing. This arrangement reduces the amount of wattless current that flows through the wiring conductors 6 and the control electrodes 10 that are located in the outer region of the casing. This in turn eliminates the need for a thick cathode with large electron emission quantities and makes it possible to use a thin cathode. Thin cathodes have only a small section at each end with reduced electron emission capability. Consequently, if the dimension of the light-emitting region on the anode substrate 2 is the same, it is possible to reduce the dimension of the casing 4 as compared with that of the conventional optical write element.

If, as in the conventional optical write element, a single cathode 11 is placed parallel to the two (zigzag) rows of light-emitting dots therebetween, the electrical field created by one row of light-emitting dots 8, which is turned off, adversely affects the light-emission capacity of the other row of light-emitting dots 8, which is turned on. However, in this embodiment, since two cathodes 22 are arranged above the respective rows of light-emitting dots 8, the above-mentioned problems can be eliminated.

As is apparently understood, the remaining portions of the optical write element 20 in this embodiment have the same functions, actions and benefits as those in the conventional optical write elements.

As described above, in the optical write element according to the present invention, since the light-emitting dot arrays are surrounded by the shielding members inside the casing, the light-emitting dots are prevented from being adversely affected by other components located around the light-emitting dot arrays. This reduces the fluctuation in the quantity of light from the light-emitting dots and makes it possible to provide a compact configuration of the casing while maintaining the same light-emitting region as in conventional optical write elements.

While preferred embodiments of the invention have been described with a certain degree of particularity with reference to the drawings, obvious modifications and variations are possible in light of the above teachings. It is therefore to be understood that within the scope of the appended claims, the invention may be practiced otherwise than as specifically described.

What is claimed as new and is desired to be secured by Letters Patent of the United States is:

1. An optical write element comprising:

a rectangular casing having an interior maintained in a high vacuum condition wherein said rectangular casing encloses at least one light-emitting dot array composed of multiple fluorescent light-emitting dots attached along a length of an anode substrate as part of the casing;

at least one cathode placed above said at least one light-emitting dot array; and a pair of shielding members extending inside said casing from said anode substrate in a direction of a width of said casing wherein said shielding members are positioned outside of a volume defined between said at least one cathode and said light-emitting dot array.

2. An optical write element comprising:

a rectangular casing having an interior maintained in a high-vacuum condition;

at least one light-emitting dot array composed of multiple fluorescent light-emitting dots attached along the length of a substrate as part of the casing;

at least one cathode filament placed above said at least one light-emitting dot array;

an insulating layer surrounding said at least one light-emitting dot array and covering at least a portion of said substrate;

at least one driver IC element placed on said insulating layer and outside of said at least one light-emitting dot array to drive said at least one light-emitting dot array; and a pair of shielding members disposed on two peripheral edges of said insulating layer located between said at least one light-emitting dot array and said driver IC element, said shield members extending upwardly beyond a position where said at least one cathode filament is located.

* * * * *